(12) United States Patent
Ishiwara (10) Patent No.: US 6,188,600 B1
(45) Date of Patent: Feb. 13, 2001

(54) MEMORY STRUCTURE IN FERROELECTRIC NONVOLATILE MEMORY AND READOUT METHOD THEREFOR

(75) Inventor: Hiroshi Ishiwara, Tokyo (JP)

(73) Assignee: Semiconductor Technology Academic Research Center, Tokyo (JP)

( * ) Notice: Under 35 U.S.C. 154(b), the term of this patent shall be extended for 0 days.

(21) Appl. No.: 09/379,522

(22) Filed: Aug. 23, 1999

(30) Foreign Application Priority Data

Aug. 28, 1998 (JP) .................................................. 10-242856
May 19, 1999 (JP) .................................................. 11-138514

(51) Int. Cl.$^7$ .................................................. G11C 11/22
(52) U.S. Cl. .................................................. 365/145; 365/149
(58) Field of Search .................................. 365/145, 149, 365/150, 185.08; 257/295

(56) References Cited

U.S. PATENT DOCUMENTS

| | | | |
|---|---|---|---|
| 5,060,191 | 10/1991 | Nagasaki et al. | 365/145 |
| 5,495,438 | 2/1996 | Omura | 365/145 |
| 5,523,964 | 6/1996 | McMillan et al. | 365/145 |
| 5,629,888 | * 5/1997 | Saito et al. | 365/145 |
| 6,046,929 | * 4/2000 | Aoki et al. | 365/145 |

FOREIGN PATENT DOCUMENTS

| | | |
|---|---|---|
| 04171978 | 6/1992 | (EP) . |
| 0 720 172 A2 | 7/1996 | (EP) . |
| 406119793 | * 4/1994 | (JP) .................................. 365/145 |
| WO 95/26570 | 10/1995 | (WO) . |

OTHER PUBLICATIONS

Ishiwara, Hiroshi, et al.; "Proposal of a Single–Transistor–Cell–Type Ferroelectric Memory Using an SOI Structure and Experimental Study on the Interference Problem in the Write Operation"; *Japanese Journal of Applied Physics*, 36:1655–1658; Mar. 1997.

Ishiwara, Hiroshi; "Current Status and Prospects of Digital and Analog Memories Using MFSFETs"; *Journal of the Korean Physical Society*, 32:S1325–S1328; Feb. 1998.

* cited by examiner

Primary Examiner—Tan T. Nguyen
(74) Attorney, Agent, or Firm—Christensen O'Connor Johnson Kindness PLLC (57) ABSTRACT

Each of memory cells of a ferroelectric nonvolatile memory includes a MOS field effect transistor and first and second ferroelectric capacitors whose remnant polarization amounts are substantially equal to each other. One-side electrodes of the first and second ferroelectric capacitors are connected to the gate electrode of the MOS field effect transistor. Information is stored by polarizing the thin ferroelectric films of the first and second ferroelectric capacitors in opposite directions to each other with respect to the gate electrode of the MOS field effect transistor. Information is read out by applying a positive voltage pulse to one of the other electrodes of the first and second ferroelectric capacitors while the other one of the other electrodes is kept in the electrically floating state. Further a negative voltage pulse having an absolute value smaller than the positive voltage pulse may be applied, if necessary.

9 Claims, 7 Drawing Sheets

MEMORY STRUCTURE IN FERROELECTRIC NONVOLATILE MEMORY AND READOUT METHOD THEREFOR

BACKGROUND OF THE INVENTION

This invention relates to a ferroelectric nonvolatile memory and more particularly to a ferroelectric nonvolatile memory having ferroelectric capacitors connected to the gates of field effect transistors of MOS or MIS structure (ferroelectric-gate FET) and a readout method for reading out information from the memory.

If a junction is made between semiconductor and ferroelectrics, it is expected that states in which holes and electrons are respectively induced on the semiconductor surface depending on the polarization direction of the ferroelectrics occur. Therefore, an attempt is already made to set the above two states to correspond to "0" and "1" and form a nonvolatile memory in which the memory contents will not be erased even if the power supply is turned OFF by use of ferroelectrics for forming the gate insulating film of the MOS field effect transistor. However, a device which can be practically used is not realized up to the present time. The most important reason why it is difficult to form the device of this structure is that a necessary current will not flow between the source and drain of the field effect transistor since traps are generated at the interface to capture holes and electrons, if the semiconductor and ferroelectrics are bonded together.

In order to solve the above problem, an MFIS (M: metal or conductor, F: ferroelectrics, I: insulator, S: semiconductor) structure having a dielectric (paraelectric) film such as a silicon dioxide ($SiO_2$) film which makes it difficult to generate interfacial traps between the ferroelectric film and the semiconductor substrate and an MFMIS structure further having a conductive film between the ferroelectric film and the dielectric film are proposed. The MFIS structure is disclosed in, for example, IEEE ELECTRON DEVICE LETTERS, VOL. 18, NO. Apr. 4, 1997 pp. 160–162 TOKUMITSU et al. "Nonvolatile Memory Operations of Metal-Ferroelectric-Insulator-Semiconductor (MFIS) FET's Using PLZT/STO/Si(100) Structures" and the MFMIS structure is disclosed in, for example, Jpn. J. Appl. Phys. Vol. 38 (1999) pp. 2285–2288 Part 1, No. 4B, April 1999 FUJIMORI et al. "Properties of Ferroelectric Memory FET Using $Sr_2(Ta,Nb)_2O_7$ Thin Film".

However, if a laminated structure of the ferroelectric film and the dielectric film is used as the gate insulating film of the field effect transistor, new problems that (1) the programming voltage of information becomes high, (2) information holding time (data retention time) becomes short and the like occur. The problems are described in detail below.

First, the problem that the programming voltage becomes high is explained by taking a concrete structure as an example. Assume that a semiconductor substrate is composed of Si, the ferroelectric film is composed of lead titanate zirconate (PZT: $PbZr_{1-x}Ti_xO_3$), and the dielectric film is composed of $SiO_2$. The same explanation may be applied to a case of the MFIS structure, but the MFMIS structure is used as the gate electrode structure to prevent mutual diffusion of Pb atoms in the PZT film and Si atoms in the $SiO_2$ film in a case of materials used in this example. The dielectric constant of $SiO_2$ is 3.9 and the dielectric constant of PZT is set to approx. 200 to 600 depending on the composition ratio of Zr and Ti, and the explanation is made by assuming that the dielectric constant thereof is 390 for simplicity. Further, as the general assumption, the thickness of the $SiO_2$ film is 1/10 of that of the PZT film.

Since the capacitance of the capacitor is proportional to the dielectric constant of the insulating film provided between the electrodes and inversely proportional to the film thickness of the insulating film, the ratio between the capacitances of the ferroelectric capacitor and the dielectric capacitor becomes 10:1. Further, when the two capacitors are connected in series and a voltage is applied thereto, voltages applied to the respective capacitors are inversely proportional to the capacitances of the capacitors, and therefore, the voltage applied to the ferroelectric capacitor is 1/10 of the voltage applied to the dielectric capacitor, that is, 1/11 of the whole voltage. Therefore, if the MFS structure in which the PZT film is directly deposited on the Si substrate can be formed and the polarization of the film can be reversed by application of 5V, a voltage which is as high as 55V is necessary to attain the polarization reversal when the MFMIS structure is formed with the same film thickness.

Figure 1A:
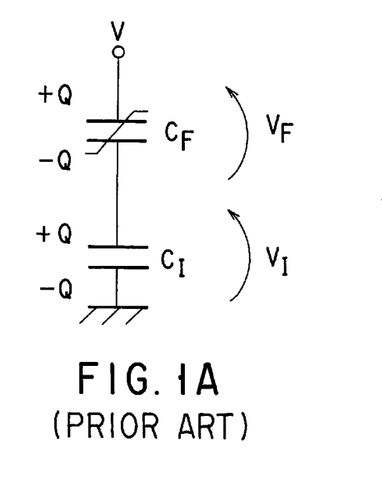
FIG. 1A is an equivalent circuit diagram of an MFMIS structure, for illustrating the conventional ferroelectric nonvolatile memory.

Next, the problem that the information holding time becomes short is explained with reference to the drawing. If the MFMIS structure is expressed by use of an equivalent circuit, a structure in which a ferroelectric capacitor $C_F$ and a dielectric capacitor $C_I$, are connected in series can be attained as shown in FIG. 1A. In this case, the depletion layer capacitance of the semiconductor is not considered and it is assumed that the entire portion of the semiconductor is kept at the ground potential.

Assuming that a voltage V is applied to the upper-side electrode, voltages of $V_F$, $V_I$ are respectively applied to the capacitors $C_F$, $C_I$. At this time, the following equation can be attained.

$$V_F + V_I = V \quad (1)$$

If the charge amount appearing on both electrodes of the ferroelectric capacitor $C_F$ is ±Q, the charges of ±Q appear on both electrodes of the dielectric capacitor $C_I$, as shown in FIG. 1A under a condition that the total amount of charges on the connecting portion between the two capacitors $C_F$, $C_I$ must be set to 0. Further, since the relation "$Q=C_I V_I$" is set in the dielectric capacitor $C_I$, the following equation can be obtained by substituting the equation (1).

$$Q = C_I(V - V_F) \quad (2)$$

Figure 1B:
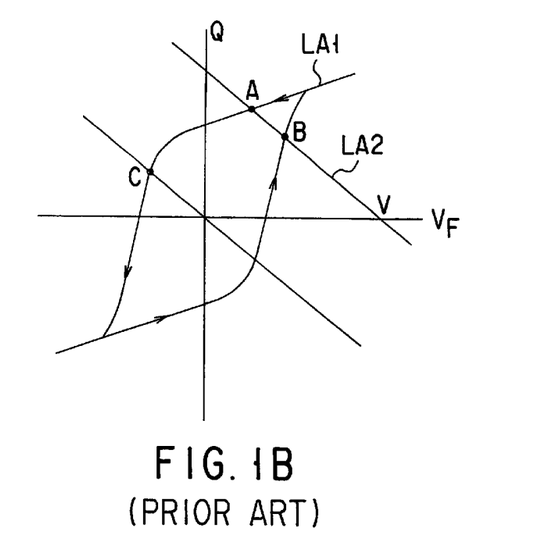
FIG. 1B is a characteristic diagram showing the relation between an applied voltage and a charge amount of a ferroelectric capacitor, for illustrating the conventional ferroelectric nonvolatile memory.

As indicated by the curve LA1 of FIG. 1B, it is known that the relation between Q and $V_F$ of the ferroelectric capacitor $C_F$ exhibits hysteresis. If the relation of the equation (2) is superposed on FIG. 1B, the straight line LA2 can be obtained as shown in FIG. 1B and intersections between the two lines indicate a voltage applied to the ferroelectrics and the amount of charges appearing on the electrode of the capacitor. The position A in FIG. 1B indicates Q and $V_F$ when a high voltage is applied in the positive direction and then the voltage is kept at V and the position B indicates Q and $V_F$ when a high voltage is applied in the negative direction and then the voltage is kept at V.

Therefore, if a high voltage is applied in the positive direction and then the voltage is returned to 0, Q and $V_F$ of the ferroelectric capacitor indicated by the position C are set and the direction of polarization and the direction of electric field are opposite to each other. That is, if information is held by returning the gate voltage to 0 after the programming operation is effected by applying a positive voltage to the gate electrode of the field effect transistor having the MFIS or MFMIS gate structure, the electric field in the opposite direction to the direction of the polarization is applied to the ferroelectrics and the remnant polarization amount disappears in a brief period of time. Particularly, when the capacitance of the dielectric capacitor serially inserted is small, the magnitude of the electric field in the opposite direction becomes closer to coercive electric field (which is required to return the polarization amount to 0) and the polarization retention time becomes extremely short.

The problem that the holding time is short cannot be neglected not only in the MFIS or MFMIS structure but also in the MFS structure in some cases. That is, the depletion layer capacitor formed on the semiconductor surface and the ferroelectric capacitor form a series-connected capacitor depending on the bias condition and substantially the same problem as that occurring as shown in FIG. 1B occurs.

Thus, in the conventional nonvolatile memory using the ferroelectrics for forming the gate insulating film of the MOS field effect transistor, it is necessary to use the MFIS or MFMIS structure so as not to generate interfacial traps between the semiconductor substrate and the ferroelectric film. However, if this type of structure is used, there occurs a problem that a voltage for programmed information becomes high and the information holding time becomes short.

BRIEF SUMMARY OF THE INVENTION

Accordingly, a first object of this invention is to provide a ferroelectric nonvolatile memory having memory cell structures each including a ferroelectric capacitor and capable of lowering the information programming voltage and making the information holding time long.

Further, a second object of this invention is to provide a storage/holding method of a ferroelectric nonvolatile memory having memory cell structures each including a ferroelectric capacitor and capable of lowering the information programming voltage and making the information holding time long.

A third object of this invention is to provide a readout method for a ferroelectric nonvolatile memory capable of permitting information to be efficiently read out from a memory cell including a ferroelectric capacitor.

The first object of this invention can be attained by a ferroelectric nonvolatile memory having memory cells each for storing information by utilizing the polarization of a ferroelectric film, comprising memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor; wherein information is stored by polarizing thin ferroelectric films of the first and second ferroelectric capacitors in opposite directions to each other with respect to the gate electrode of the field effect transistor.

Further, the first object of this invention can be attained by a ferroelectric nonvolatile memory comprising a plurality of thin single crystal Si films formed in parallel in a stripe form on an insulating substrate, each stripe being separated in a stripe direction and having a junction structure of a first semiconductor region of a first conductivity type, a second semiconductor region of a second conductivity type and a third semiconductor region of the first conductivity type; a thin dielectric film formed to cover the thin single crystal Si films; a plurality of gate electrodes formed on the thin dielectric film to cover at least the second semiconductor regions which lie at the center of the junction structures along the stripes of the thin single crystal Si films; a thin ferroelectric film formed on the thin dielectric film and gate electrodes; a plurality of first stripe-form electrodes whose upper surfaces and side surfaces are covered with thin insulating films and which are arranged on the thin dielectric film to pass above the gate electrodes in a direction perpendicular to the stripes of the thin single crystal Si films; and a plurality of second stripe-form electrodes arranged on the thin dielectric film and first stripe-form electrodes to pass above the gate electrodes in a direction parallel to the stripes of the thin single crystal Si films; wherein an overlapping area of the first stripe-form electrode and the gate electrode is substantially equal to an area in which the second stripe-form electrode and the gate electrode overlap each other without interposing the first stripe-form electrode therebetween.

Further, the first object of this invention can be attained by a ferroelectric nonvolatile memory comprising a plurality of thin single crystal Si films formed in parallel in a stripe form on an insulating substrate, each stripe being separated in a stripe direction and having a junction structure of a first semiconductor region of a first conductivity type, a second semiconductor region of a second conductivity type and a third semiconductor region of the first conductivity type; a thin dielectric film formed to cover the thin single crystal Si films; a plurality of gate electrodes formed on the thin dielectric film to cover at least the second semiconductor regions which lie at the center of the junction structures along the stripes of the thin single crystal Si films; a first thin ferroelectric film formed on the thin dielectric film and gate electrodes; a plurality of first stripe-form electrodes arranged on the first thin dielectric film to pass above the gate electrodes in a direction perpendicular to the stripes of the thin single crystal Si films; a second thin ferroelectric film formed on the first stripe-form electrodes and gate electrodes; and a plurality of second stripe-form electrodes arranged on the second thin ferroelectric film to pass above the gate electrodes in a direction parallel to the stripes of the thin single crystal Si films; wherein an overlapping area of the first stripe-form electrode and the gate electrode is substantially equal to an area in which the second stripe-form electrode and the gate electrode overlap each other without interposing the first stripe-form electrode therebetween.

With the above construction, the two ferroelectric capacitors having substantially the same remnant polarization amount are connected to the gate electrode of the field effect transistor, forming a memory cell, and information is stored by the polarization direction and remnant polarization of the thin ferroelectric film. Further, since the thin ferroelectric films of the capacitors are polarized in opposite directions to each other with respect to the gate electrode of the transistor, at the time of storage of information, remnant polarization substantially equal charges caused by the polarization of the thin ferroelectric film are not induced on the semiconductor surface acting as the channel region of the transistor.

In this case, the information programming voltage can be lowered since the voltage is applied directly to the thin ferroelectric film. Further, the information can be held for a long time, because the internal electric fields of the two ferroelectric capacitors are 0, no matter whether the information is "0" or "1". It should be noted that the information is "1" when the first and second ferroelectric capacitors are polarized upwards and downwards, respectively, and is "0" when the first and second ferroelectric capacitors are polarized downwards and upwards, respectively.

Further, the second object of this invention can be attained by a storage/holding method of a ferroelectric nonvolatile memory having memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor; comprising the steps of polarizing the thin ferroelectric films of the first and second ferroelectric capacitors in opposite directions to each other with respect to the gate electrode of the field effect transistor by grounding the other electrode of the second ferroelectric capacitor and applying a voltage to the other electrode of the first ferroelectric capacitor; and setting the other electrode of the first ferroelectric capacitor to 0V.

With the above method, since the voltage is directly applied to the thin ferroelectric film, the information programming voltage can be lowered. Further, the information can be held for a long time, because the internal electric fields of the two ferroelectric capacitors are 0, no matter whether the information is "0" or "1". It should be noted that the information is "1" when the first and second ferroelectric capacitors are polarized upwards and downwards, respectively, and is "0" when the first and second ferroelectric capacitors are polarized downwards and upwards, respectively.

The third object of this invention can be attained by a readout method of a ferroelectric nonvolatile memory which has memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor and in which information is stored by polarizing the thin ferroelectric films of the first and second ferroelectric capacitors in opposite directions to each other with respect to the gate electrode of the field effect transistor, comprising the steps of setting the other electrode of the second ferroelectric capacitor into an electrically floating state; applying a positive voltage pulse to the other electrode of the first ferroelectric capacitors; and detecting a drain current in the field effect transistor to determine stored information.

Further, the third object of this invention can be attained by a readout method of a ferroelectric nonvolatile memory which has memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor and in which information is stored by polarizing the thin ferroelectric films of the first and second ferroelectric capacitors in opposite directions to each other with respect to the gate electrode of the field effect transistor, comprising the steps of setting the other electrode of the second ferroelectric capacitor into an electrically floating state; applying a positive voltage pulse to the other electrode of the first ferroelectric capacitor; and subsequently applying a negative voltage pulse whose absolute value is smaller than the positive voltage pulse to the other electrode of the first ferroelectric capacitor.

In the above method, the negative voltage pulse, which has a smaller absolute value than the positive voltage pulse, is applied after the positive voltage pulse is applied to the other electrode of the first ferroelectric capacitor, while the other electrode of the second ferroelectric capacitor is electrically floating to read information. The application of the negative voltage pulse is useful in suppressing the reduction of the remnant polarization, in case where the programming data is "1". In this regard, it should be noted that the programming data is "0" when the first and second ferroelectric capacitors are polarized downwards and upwards, respectively, and is "1" when the first and second ferroelectric capacitors are polarized upwards and downwards, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[First Embodiment]

Figure 2A:
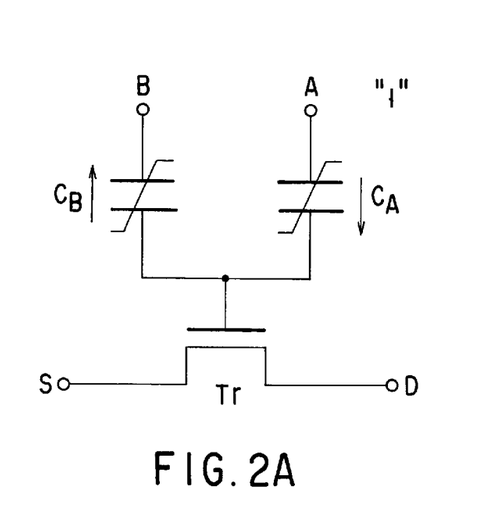
FIG. 2A is a equivalent circuit diagram of a memory cell in a ferroelectric nonvolatile memory according to a first embodiment of this invention, which stores programmed information of "1"
Figure 2B:
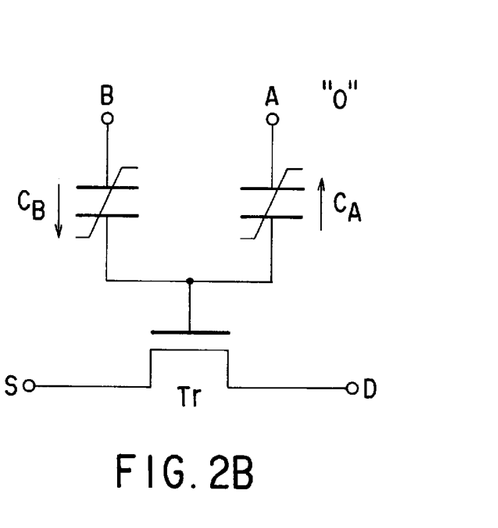
FIG. 2B is a equivalent circuit diagram of a memory cell in a ferroelectric nonvolatile memory according to a first embodiment of this invention, which stores programmed information of "0"

FIGS. 2A and 2B are equivalent circuit diagrams showing the structure of a memory cell in a ferroelectric nonvolatile memory according to a first embodiment of this invention.

One-side electrodes of the electrodes of two ferroelectric capacitors $C_A$, $C_B$ having the same remnant polarization amount are connected to the gate of a field effect transistor of MOS structure (MOSFET) Tr and the other electrodes of the ferroelectric capacitors $C_A$, $C_B$ are respectively connected to terminals A and B. The transistor Tr and the ferroelectric capacitors $C_A$, $C_B$ constitute one memory cell. As the dielectric film of each of the ferroelectric capacitors $C_A$, $C_B$, PZT, for example, is used and the areas and film thicknesses of the capacitors are set to the same values.

The memory cell in this embodiment can be used as an analog memory, but in this example, a case wherein it is used as a digital memory is explained for simplifying the explanation and the operation thereof is explained. Although not shown in the drawing, the memory cells are arranged in a matrix form to constitute a memory cell array.

In order to program "0 ", "1" data into the memory cell of this embodiment, the terminal B is grounded and a positive or negative voltage is applied to the terminal A. In a case where the gate capacitance of the transistor Tr is large and an influence by the potential on the semiconductor side cannot be neglected, the potential of the semiconductor is set in the electrically floating state or it is applied with half the voltage applied to the terminal A so as to set the potential equal to the intermediate potential of the two series-connected ferroelectric capacitors $C_A$ and $C_B$.

Now, a positive voltage is applied to the terminal A to set a state in which the polarization direction of the ferroelectric capacitor $C_A$ is downward and the polarization direction of the ferroelectric capacitor $C_B$ is upward as shown in FIG. 2A to "1". Further, a negative voltage is applied to the terminal A to set a state in which the polarization direction of the ferroelectric capacitor $C_A$ is upward and the polarization direction of the ferroelectric capacitor $C_B$ is downward as shown in FIG. 2B to "0".

If the voltage of the terminal A is returned to 0 after "0" or "1" is programmed, no charge is induced on the semiconductor surface of the channel region and the gate electrode of the transistor Tr since the remnant polarization amounts of the two ferroelectric capacitor $C_A$, $C_B$ are equal to each other. Therefore, $V_G$ becomes 0V based on the relation of $Q_G=C_G V_G$ ($Q_G$: charge amount of the gate electrode, $C_G$: gate capacitance, $V_G$: gate potential). Therefore, the internal electric fields of the two ferroelectric capacitors $C_A$, $C_B$ become 0 even when information is held in either state of "0" or "1" and the information holding time can be made as long as in a normal ferroelectric memory cell of one transistor/one capacitor type having the structure similar to a DRAM. Further, since a voltage is directly applied to the ferroelectric capacitor, the programming voltage can be lowered even if the dielectric constant of the ferroelectric film is large.

Next, in order to read out information programmed into the memory cell, the terminal A is set into the open state, the semiconductor substrate is grounded and a positive voltage is applied to the terminal B. In this case, if programmed information is "1" as shown in FIG. 2A, the polarization amount of the ferroelectric capacitor $C_B$ is significantly changed and the charge amount $Q_G$ of the gate electrode is not kept at 0. If the polarization amount of the ferroelectric film at the time of application of the positive voltage is P, $Q_G=(Pr+P)S$ (S: the area of the ferroelectric capacitor, $P_r$: the remnant polarization amount of the ferroelectric film). In this case, $P=-P_r$ before the positive voltage is applied and $P=P_s$ ($P_s$: saturation polarization amount) if a sufficiently high positive voltage is applied. As a result, charges of $-Q_G$ are generated near the semiconductor surface, and the source-drain path is made conductive by inverted electrons by adequately selecting the threshold voltage of the transistor Tr.

If programmed information is "0", the polarization reversal of the ferroelectric film does not occur and charges of $Q_G$ generated on the gate electrode are set to $(P_s-P_r)S$ even if the positive voltage to be applied is sufficiently high. Generally, since a difference between $P_s$ and $P_r$ is small, negative charges are not almost induced on the semiconductor surface. That is, the source-drain path of the transistor Tr is not made conductive in this case.

Therefore, the readout operation can be effected by applying the pulse voltage to the terminal B and measuring the drain current in the MOSFET at this time. In the readout operation, since a voltage is applied via the gate insulating film of the MOSFET, a problem that the readout voltage will become high may occur. However, it is not necessary to apply the readout voltage until the relation of $P=P_s$ is attained in the case of the programmed information of "1" and the relation $Q_G=P_r S$ can be attained even if a voltage which causes $P=0$ is applied and the sufficient readout operation can be performed.

After the readout operation, the potentials of the terminals A and B are set back to 0V. In the case of the programmed information of "0", $Q_G=0$ and the state before the readout operation is restored. If the programmed information is "1", the polarization may not completely return to the original state when the readout voltage is changed back to 0V. In this case, information "1" may be reprogrammed repeatedly at an appropriate frequency on the basis of the readout information, in order to make the polarization to completely return to the original state.

Thus, according to this embodiment, information can be stored by the polarization direction of the thin ferroelectric film and the remnant polarization without inducing charges caused by the polarization of the thin ferroelectric film in the channel region of the transistor by grounding the terminal B, applying the positive or negative voltage to the terminal A and polarizing the thin ferroelectric films of the ferroelectric capacitors $C_A$, $C_B$ in the opposite directions to each other with respect to the gate electrodes. Therefore, since the internal electric fields of the two ferroelectric capacitors $C_A$, $C_B$ become 0 irrespective of the state of "0" or "1" in which information is stored, the information holding time can be made long. Further, since the voltage is directly applied to the thin ferroelectric film, the information programming voltage can be lowered.

[Second Embodiment]

Next, a second embodiment of this invention is explained. This embodiment is similar to the first embodiment in the basic construction, but the film thickness of the thin ferroelectric film of a capacitor $C_A$ is made sufficiently larger than the film thickness of the thin ferroelectric film of a capacitor $C_B$. For example, if the film thickness of the thin ferroelectric film of the capacitor $C_B$ is set to approx. 0.1 $\mu$m, it is preferable to set the film thickness of the thin ferroelectric film of the capacitor $C_A$ to 0.2–0.3 $\mu$m, that is, the film thickness of the thin ferroelectric film of the capacitor $C_A$ is twice to three times that of the thin ferroelectric film of the capacitor $C_B$.

The programming method for the memory in this embodiment is substantially the same as in the first embodiment, but if the gate capacitance of the MOSFET is large and an influence by the potential on the semiconductor side cannot be neglected, the potential of the semiconductor is set in the electrically floating state or a bias voltage is applied to the semiconductor so as to set the potential thereof equal to a potential at the intermediate position of the two series-connected ferroelectric capacitors.

Figure 3A:
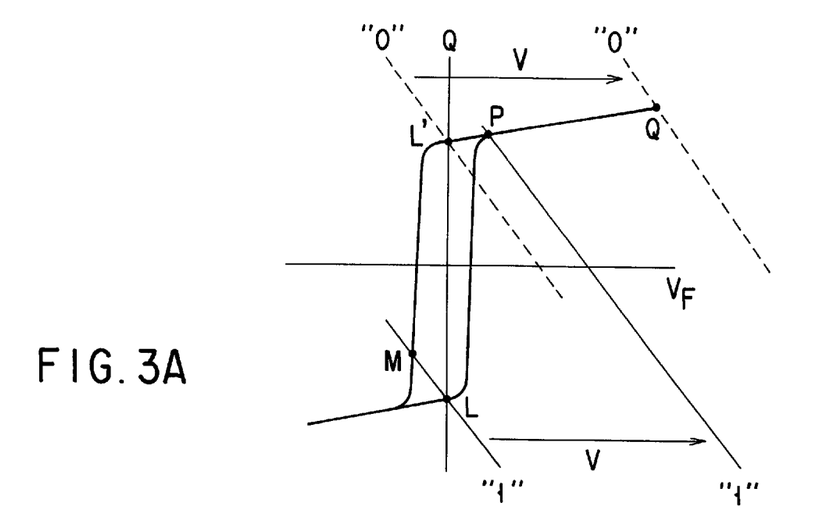
FIGS. 3A to 3C are characteristic diagrams showing the relation between a charge amount and a voltage applied to a second terminal, for illustrating a data readout method in a ferroelectric nonvolatile memory according to a second embodiment of this invention.

Further, the readout method is substantially the same as in the first embodiment, and the terminal A is set into the open state, the semiconductor substrate is grounded and a positive pulse voltage is applied to the terminal B. If the operation is shown on the $Q$-$V_F$ characteristic expressed by charges Q appearing on the metal electrode of the capacitor $C_B$ and the voltage $V_F$ between the electrodes, the characteristic diagram as shown in FIG. 3A can be obtained.

That is, first, in the state "1" shown in FIG. 2A, since charges of $+P_rS$ initially appear on the lower electrode of the capacitor $C_B$, charges of $\pm(Q+P_rS)$ appear on both ends of a capacitor $C_I$, in the equivalent circuit shown in FIG. 1A if a voltage V is applied to the upper terminal, and charges of $\pm Q$ appear on both ends of the capacitor $C_B$. As a result, the relation of $Q+P_rS = C_I V_I = C_I(V-V_F)$ is obtained and the straight line "1" in FIG. 3A can be obtained. Therefore, if the above pulse voltage is applied and returned to 0V, the operation point which initially lies at the position L moves to the position M via the positions P and L'. As shown in FIG. 3A, if the position M lies in the third quadrant, the direction of the electric field and the polarization direction coincide with each other and the remnant polarization amount will not be reduced even if it is left as it is.

In this explanation, it is assumed that a high programming voltage is applied and the operation point moves along the saturation hysteresis curve, but in the actual readout operation, it is sufficient if the operation point reaches approximately the coercive voltage. In this case, the operation point after the read out operation lies on somewhere on a straight line connecting the position L and position M. In the state "0" shown in FIG. 2B, since charges of $-P_rS$ initially appear on the lower electrode of the capacitor $C_B$, the straight line "0" in FIG. 3A can be obtained. Therefore, if the above pulse voltage is applied and returned to 0V, the operation point which initially lies at the position L' moves back to the position L' via the position Q.

Next, the characteristic obtained in a case wherein the terminals A, B are grounded to hold information after the readout operation is effected is explained. If the voltage of the capacitor $C_B$ is $V_F$ and the voltage of the capacitor $C_A$ is $V_F'$, the relation of $V_F+V_F'=0$ is obtained and the hysteresis characteristics for the capacitors shown in FIG. 3B can be obtained. That is, if the operation point lies at the position L or position L', the internal electric field is not generated in either capacitor and it is understood that the remnant polarization can be held for a long period of time.

Figure 3B:
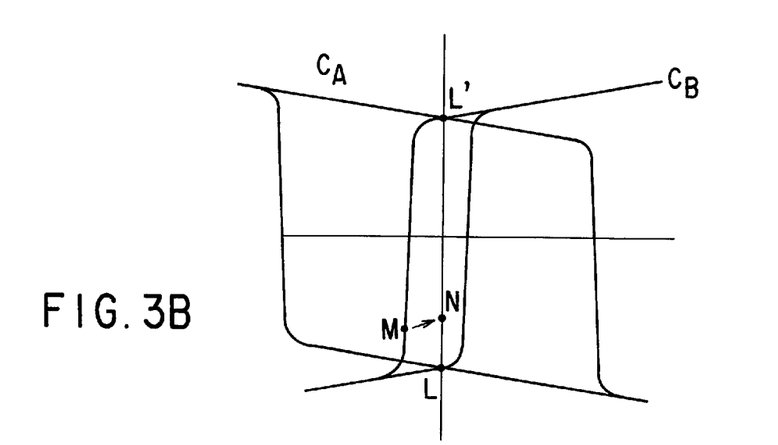

If the operation point lies at the position M, charges corresponding to a difference between the remnant polarization amounts of the capacitors appear on the gate electrode of the MOSFET and the potential obtained by dividing the charge amount by the gate capacitance acts as the depolarization field with respect to the ferroelectric film of the capacitor $C_A$. Therefore, in a long period of time, the remnant polarization amount of the capacitor $C_A$ is reduced and it becomes stable when the remnant polarization amounts of the capacitors become equal to each other.

The stable point is a point at which the minor loop intersects the ordinate when the voltage is inverted from the position M of the capacitor $C_B$. If the position M is near the position L, the reduced amount of the remnant polarization and the depolarization field are both small, and therefore, it is expected that a reduction period of time in the remnant polarization of the capacitor $C_A$ is for several days or more in the device now available or at least several weeks in the future. Therefore, even if the readout operations are frequently effected in a short period of time, programmed information will not be lost. That is, the nondestructive readout operation can be effected for a long period of time of several days to several weeks.

Figure 3C:
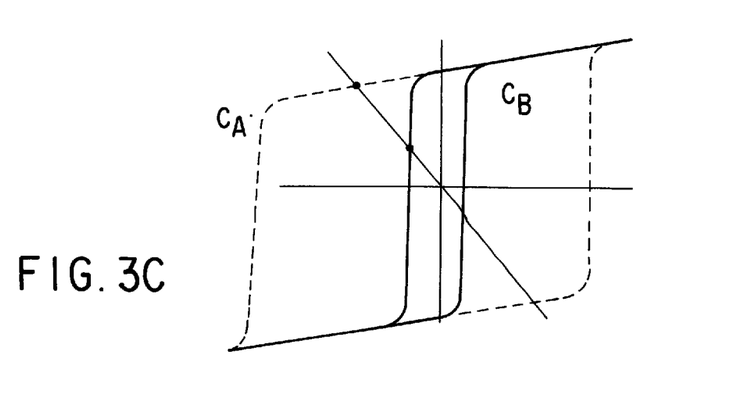

In order to clearly define the feature of a function-separation type ferroelectric gate transistor in which the readout function and storage/holding function are separated, the structures obtained by arranging only the capacitor $C_A$ on a MOSFET which has the same structure as this embodiment and arranging only the capacitor $C_B$ thereon are formed for comparison. In this case, since the polarization characteristic is expressed as shown in FIG. 1B, intense depolarization field is generated in the film of each capacitor as shown in FIG. 3C by substituting the parameters used in FIGS. 3A to 3C and the remnant polarization is reduced to 0 by the electric field. On the other hand, if the function-separation type is used and a difference between the film thicknesses of the capacitors is made large, a reduced amount of the remnant polarization and depolarization field can be both made small. Further, in the stable state in which the depolarization field is 0, the remnant polarization does not become 0 and the long-term storage characteristic is excellent.

[Third Embodiment]

Figure 4A:
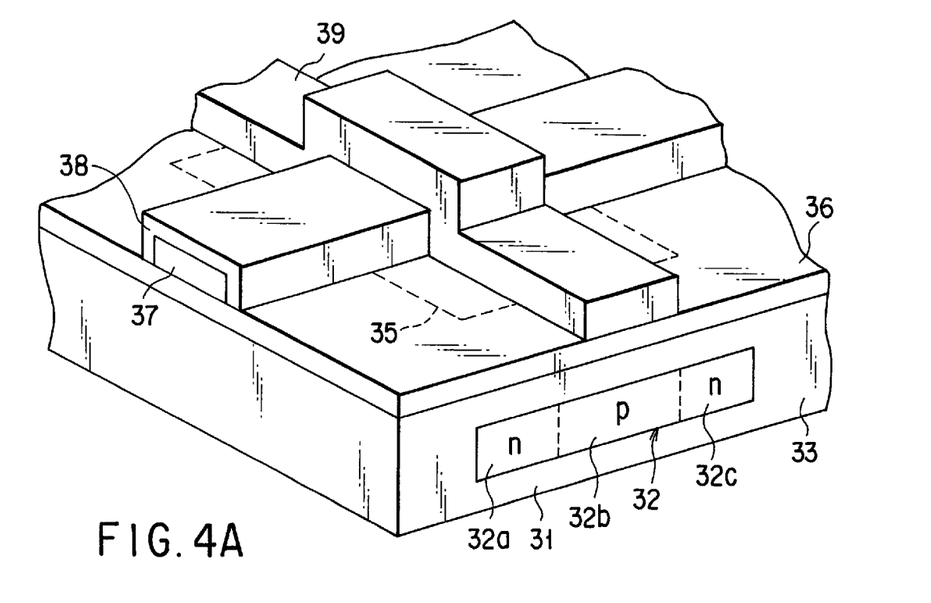
FIG. 4A is a perspective view showing a memory cell structure, for illustrating the construction of a ferroelectric nonvolatile memory according to a third embodiment of this invention.
Figures 4B, 4C:
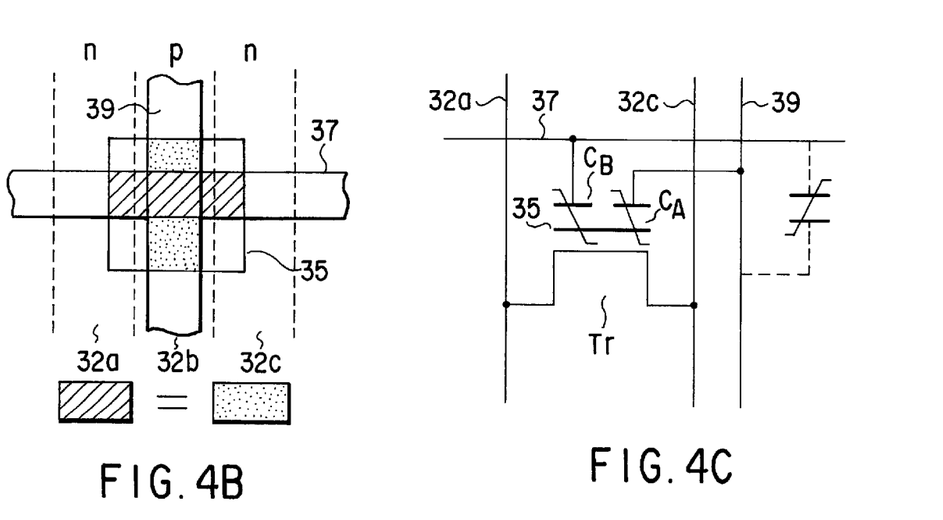
FIG. 4B is a pattern plan view showing the memory cell structure, for illustrating the construction of the ferroelectric nonvolatile memory according to the third embodiment of this invention.
FIG. 4C is an equivalent circuit diagram of the memory cell structure, for illustrating the construction of the ferroelectric nonvolatile memory according to the third embodiment of this invention.

FIGS. 4A to 4C illustrate the construction of a ferroelectric nonvolatile memory according to a third embodiment of this invention, and FIG. 4A is a perspective view showing the memory cell structure, FIG. 4B is a pattern plan view showing the overlapping state of the gate electrode and the wiring electrode, and FIG. 4C is an equivalent circuit diagram. This embodiment is obtained by forming the structure of the first embodiment at high density by use of an SOI (Silicon-On-Sapphire) substrate.

A stripe 32 of thin single crystal Si film is formed on an insulating substrate 31 composed of an Si substrate and an SiO$_2$ film or the like formed on the Si substrate. A dielectric film 33 such as an SiO$_2$ film is formed by deposition on the above structure. The Si stripe 32 is composed of an npn structure divided in the stripe direction. In the drawing, one cell portion is shown, but in practice, a plurality of Si stripes 32 are arranged.

One rectangular gate electrode 35 composed of conductive material such as polysilicon or Pt is formed on the dielectric film 33 for each cell to cover a p region 32b which is the central portion of the Si stripe 32. A ferroelectric film 36 of PZT, for example, is formed on the gate electrode 35 and dielectric film 33. A first stripe-form electrode 37 composed of Pt or the like is formed in a direction perpendicular to the Si stripe 32 on the ferroelectric film 36. In this case, the first stripe-form electrode 37 is formed to intersect all of the Si stripes and pass above the gate electrode 35 in each stripe.

An insulating film 38 for preventing the short circuit with a second stripe-form electrode 39 which will be described later is formed on the upper surface and side surfaces of the first stripe-form electrode 37. The second stripe-form electrode 39 is formed in a direction parallel to the Si stripe 32 on the ferroelectric film 36 and the first stripe-form electrode 37. An overlapping area of the first stripe-form electrode 37 and the gate electrode 35 and an overlapping area of the second stripe-form electrode 39 and the gate electrode 35 (except an overlapping area of the first and second stripe-form electrodes 37 and 39) are set equal to each other.

As shown in the equivalent circuit shown in FIG. 4C, in the memory cell with the above construction, one-side electrodes of the two ferroelectric capacitors $C_A$, $C_B$ are commonly used with the gate electrode 35 of the n-channel MOS field effect transistor Tr. Further, the drain region (or source region) of the MOS field effect transistor Tr corresponds to a region 32a of the Si stripe 32 and the source region (or drain region) thereof corresponds to a region 32c of the Si stripe 32. The n regions 32a, 32c act as paired bit lines BL, $\overline{BL}$. The other electrode of the ferroelectric capacitor $C_A$ corresponds to the second stripe-form electrode 39 and the other electrode of the ferroelectric capacitor $C_B$ corresponds to the first stripe-form electrode 37. The first stripe-form electrode 37 acts as a word line WL and the second stripe-form electrode 39 acts as a plate line PL.

The word line WL (first stripe-form electrode 37), paired bit lines BL, $\overline{BL}$ (regions 32a, 32c of the Si stripe 32) and plate line PL (second stripe-form electrode 39) are supplied with decode signals from a row decoder, column decoder and plate decoder (not shown), for example. The information programming, storage/holding and readout operations are effected as described before for the memory cell selected by the decoders.

With the above construction, it is of course possible to attain the same effect as that of the first embodiment and since a large number of cells can be integrated with high integration density, it is advantageous to form a large capacity memory.

[Fourth Embodiment]

Figure 5A:
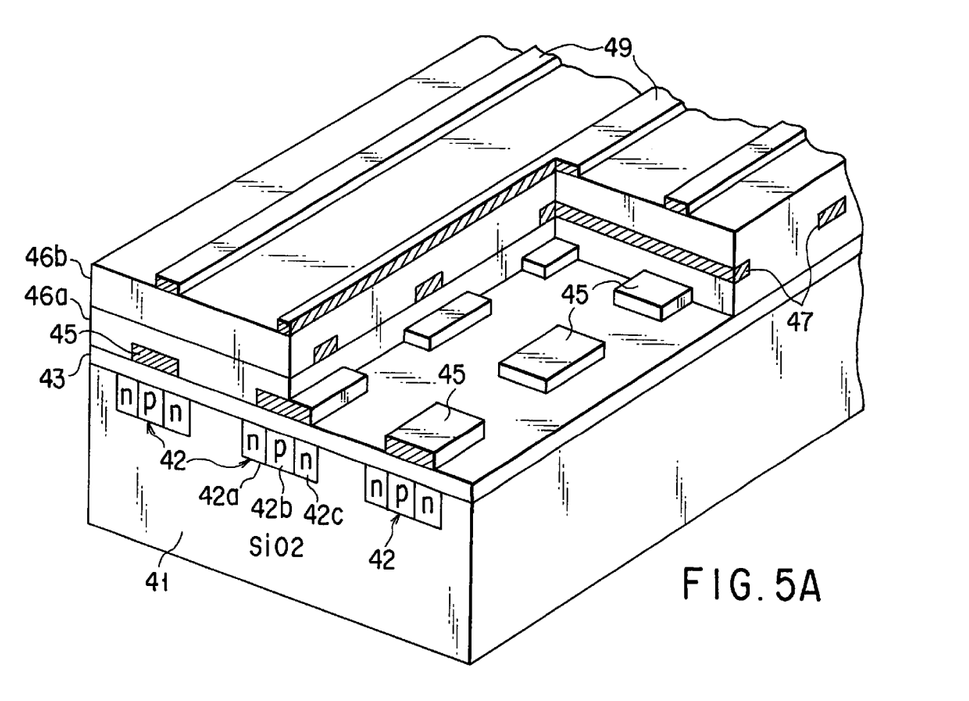
FIG. 5A is a perspective view showing a memory cell structure, for illustrating the construction of a ferroelectric nonvolatile memory according to a fourth embodiment of this invention.
Figure 5B:
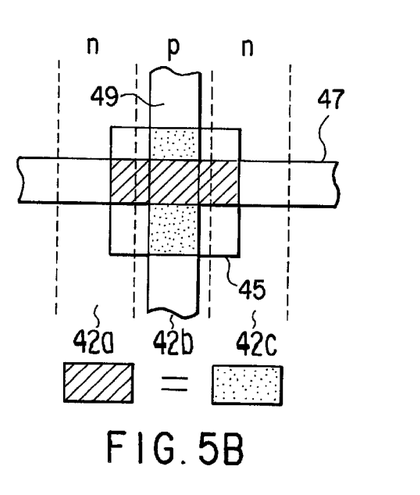
FIG. 5B is a pattern plan view showing the memory cell structure, for illustrating the construction of the ferroelectric nonvolatile memory according to the fourth embodiment of this invention.
Figure 5C:
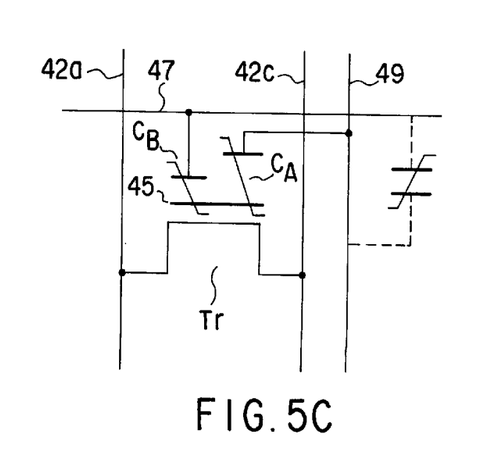
FIG. 5C is an equivalent circuit diagram of the memory cell structure, for illustrating the construction of the ferroelectric nonvolatile memory according to the fourth embodiment of this invention.

FIGS. 5A to 5C illustrate the construction of a ferroelectric nonvolatile memory according to a fourth embodiment of this invention, and FIG. 5A is a perspective view showing a memory cell structure, FIG. 5B is a pattern plan view showing a state in which the gate electrode and the wiring electrode overlap each other, and FIG. 5C is an equivalent circuit diagram. This embodiment is obtained by forming the structure of the second embodiment with high density by use of an SOI (Silicon-On-Insulator) substrate.

A plurality of stripes 42 of thin single crystal Si films are formed in parallel on an insulating substrate 41 of SiO$_2$ or the like and a dielectric film 43 is deposited on the above structure. The stripe 42 has an npn structure which is divided in the stripe direction.

One rectangular gate electrode 45 composed of conductive material is formed on the dielectric film 43 for each cell in order to cover the central p region 42b of the Si stripe 42. A first ferroelectric film 46a is formed on the gate electrodes 45 and dielectric film 43. First stripe-form electrodes 47 are formed in a direction perpendicular to the Si stripe 42 on the first ferroelectric film 46a. Further, a second ferroelectric film 46b is formed on the first ferroelectric film 46a and first stripe-form electrodes 47 and second stripe-form electrodes 49 are formed in parallel to the Si stripe 42 on the second ferroelectric film 46b.

In this case, an overlapping area of the first stripe-form electrode 47 and the gate electrode 45 and an overlapping area of the second stripe-form electrode 49 and the gate electrode 45 (except an overlapping area of the first and second stripe-form electrodes 47 and 49) are set equal to each other. However, the film thickness of the ferroelectric film of the capacitor by the second stripe-form electrode 49 is made larger than the film thickness of the ferroelectric film of the capacitor by the first stripe-form electrode 47.

As shown in the equivalent circuit shown in FIG. 5C, in the memory cell with the above construction, one-side electrodes of the two ferroelectric capacitors $C_A$, $C_B$ are commonly used with the gate electrode 45 of the n-channel MOS field effect transistor Tr. Further, the drain region (or source region) of the MOS field effect transistor Tr corresponds to a region 42a of the Si stripe 42 and the source region (or drain region) thereof corresponds to a region 42c of the Si stripe 42. The n regions 42a, 42c act as paired bit lines BL, $\overline{BL}$. The other electrode of the ferroelectric capacitor $C_A$ corresponds to the second stripe-form electrode 49 and the other electrode of the ferroelectric capacitor $C_B$ corresponds to the first stripe-form electrode 47. The first stripe-form electrodes 47 act as word lines WL and the second stripe-form electrodes 49 act as plate lines PL.

The word lines WL (first stripe-form electrodes 47), paired bit lines BL, $\overline{BL}$ (regions 42a, 42c of the Si stripes 42) and plate lines PL (second stripe-form electrodes 49) are supplied with decode signals from a row decoder, column decoder and plate decoder (not shown), for example. The information programming, storage/holding and readout operations are effected as described before for a memory cell selected by the decoders.

With the above construction, it is of course possible to attain the same effect as that of the first embodiment and since a large number of cells can be integrated with high integration density, it is advantageous to form a large capacity memory.

Figure 6A:
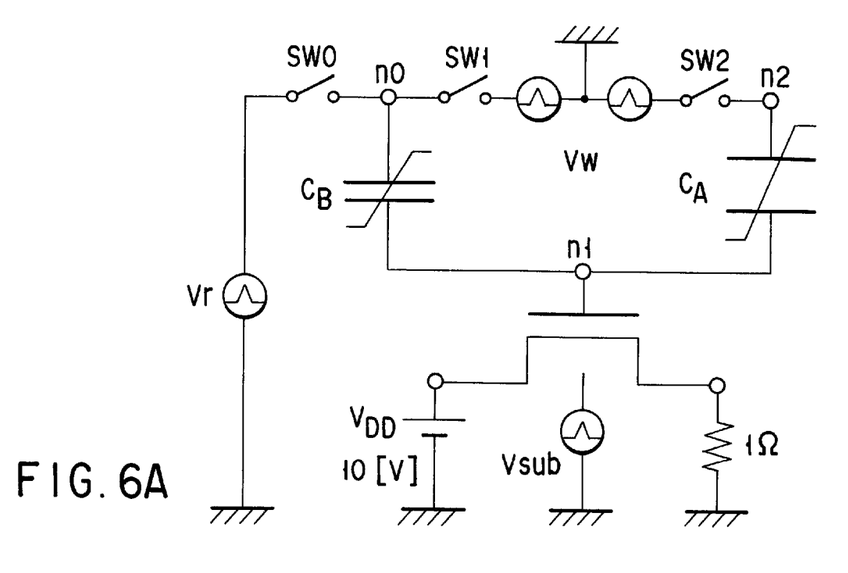
FIG. 6A is a circuit diagram showing the construction of a circuit used for analysis of the memory operation.
Figure 6B:
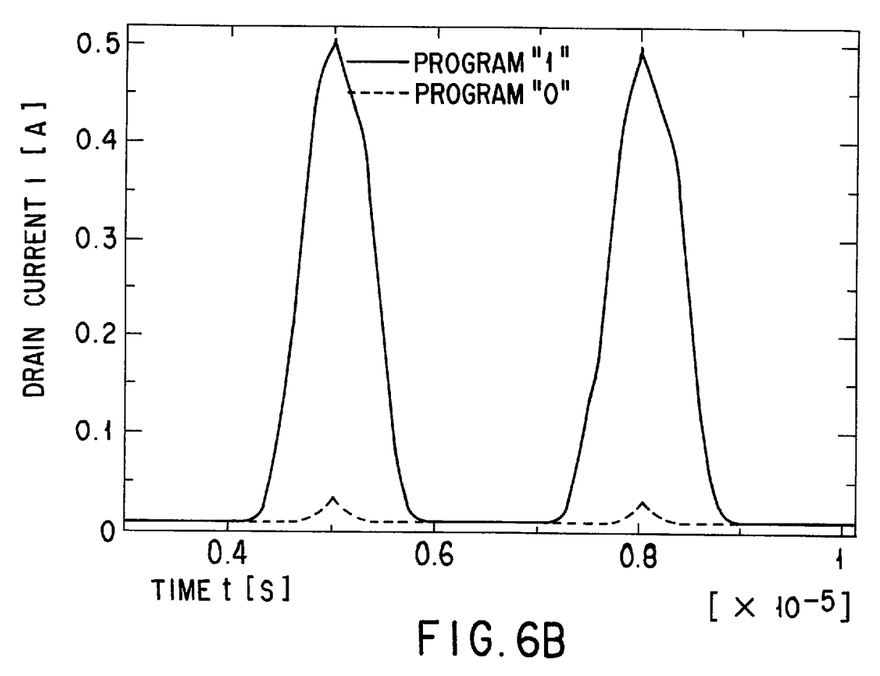
FIG. 6B is a characteristic diagram showing a variation in the drain current at the time of application of the readout voltage in the circuit used for analysis of the memory operation.

Next, the result obtained by analyzing the characteristic of the transistor with the above construction by use of a circuit simulator SPICE is shown. FIG. 6A shows a circuit used for the operation analysis and FIG. 6B shows a variation in the drain current at the time of application of a readout pulse.

In the circuit shown in FIG. 6A, data of "0" or "1" is stored by applying a positive voltage or negative voltage to a terminal n2 while a switch SW0 is set in the OFF state, a switch SW1 is set in the ON state and a switch SW2 is set in the OFF state, and the stored state is maintained by setting the switch SW0 in the OFF state, setting the switch SW1 in the ON state and setting the switch SW2 in the ON state. Then, data is read out by applying a voltage to a terminal n0 while the switch SW0 is set in the ON state, the switch SW1 is set in the OFF state and switch SW2 is set in the OFF state. It is understood from FIG. 6B that readout of "0", "1" can be easily effected by measuring the drain current.

[Fifth Embodiment]

FIGS. 7A, 7B, 8A, 8B and 9 are diagrams for illustrating a readout method of a ferroelectric nonvolatile memory according to a fifth embodiment of this invention.

Figure 7A:
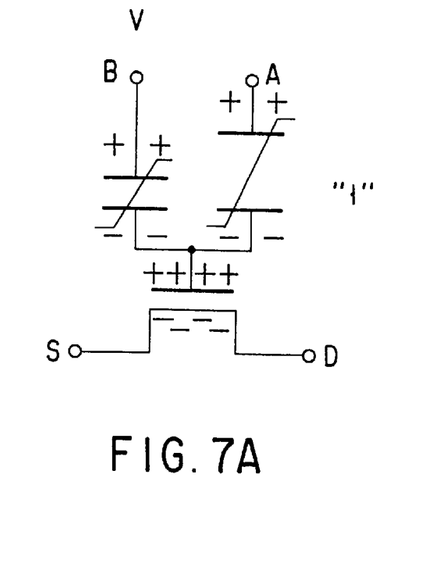
FIG. 7A is an equivalent circuit diagram showing a variation in the charge amount at the time of readout of "1" data.
Figure 7B:
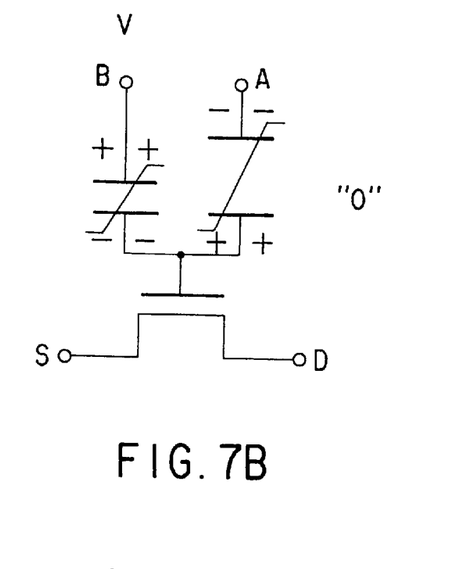
FIG. 7B is an equivalent circuit diagram showing a variation in the charge amount at the time of readout of "0" data.

In the first embodiment described before, the positive voltage is applied to the terminal B while the terminal A is kept in the electrically floating state when storage information of the cell is read out. FIG. 7A shows a state in which the readout voltage is applied when programming data is "1" and FIG. 7B shows a state in which the readout voltage is applied when programming data is "0".

Figure 8A:
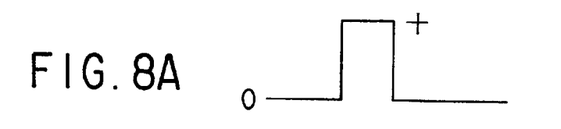
FIGS. 8A and 8B are waveform diagrams showing readout voltage pulses.
Figure 9:
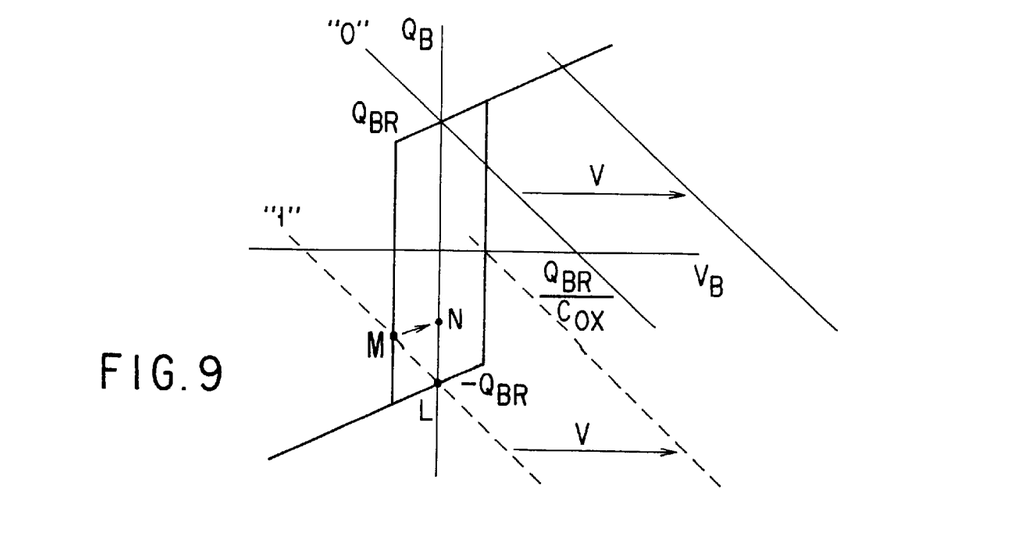
FIG. 9 is a characteristic diagram for illustrating the movement of charges at the time of readout of "0" and "1" data.

In this case, a simple pulse as shown in FIG. 8A is used as the readout voltage. At this time, the remnant polarization is kept unchanged as shown in FIG. 9 after the readout operation when programming data is "0". If the programmed information is "1", however, data will be held at the position M after the readout operation even if data is initially held at the position L. Consequently, the remnant polarization may considerably reduces. In this case, the reprogramming operation may be repeated at an appropriate frequency after the data "1" has been read out.

Figure 8B:
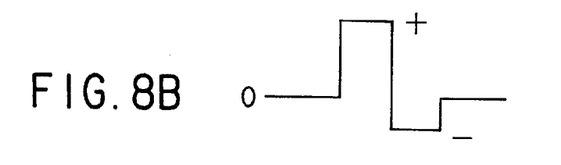

For this reason, in this embodiment, as shown in FIG. 8B, a method for reading out data by successively applying a positive voltage pulse and a negative voltage pulse with a lower amplitude is effected as another readout method. The level of the negative pulse is typically ½ to ⅓ of that of the positive pulse. As a result, even if the programming data is "1", the holding point after termination of the readout operation is substantially returned to the position L of FIG. 9 and an amount of a reduction in the remnant polarization can be suppressed. Further, the remnant polarization is reduced by applying the negative pulse if the programming data is "0", but since the absolute value of the negative pulse is small, a reduction amount of the remnant polarization can be suppressed as small as negligible in the case of the programming data "0".

Thus, according to this embodiment, a reduction amount of the remnant polarization can be suppressed in a case where the programming data is "1" by applying a positive voltage pulse to the terminal B and successively applying a negative voltage pulse with a smaller absolute value than the positive voltage pulse at the time of data readout. Therefore, the reprogramming operation becomes almost unnecessary for reading out the programming data "1" and the readout operation can be simplified.

This invention is not limited to the above embodiments. In the above embodiments, PZT is used as the ferroelectric material of the ferroelectric capacitor, but this is not limitative and any other ferroelectric material can be used. As the two ferroelectric capacitors connected to the gate electrode of the MOS transistor, the film thicknesses of the ferroelectric films may be made equal to each other or different from each other, but it is necessary to use the same constituent material therefor and set the areas thereof equal to each other.

Figure 10:
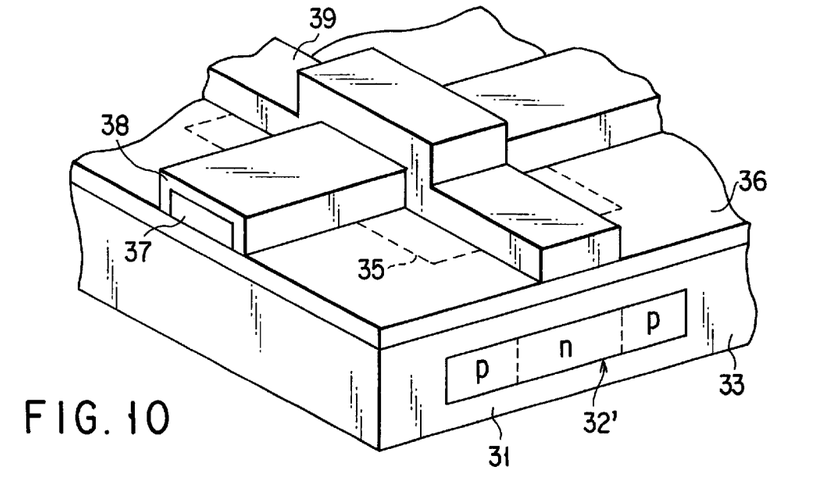
FIGS. 10 and 11 are perspective views for illustrating modifications of this invention.
Figure 11:
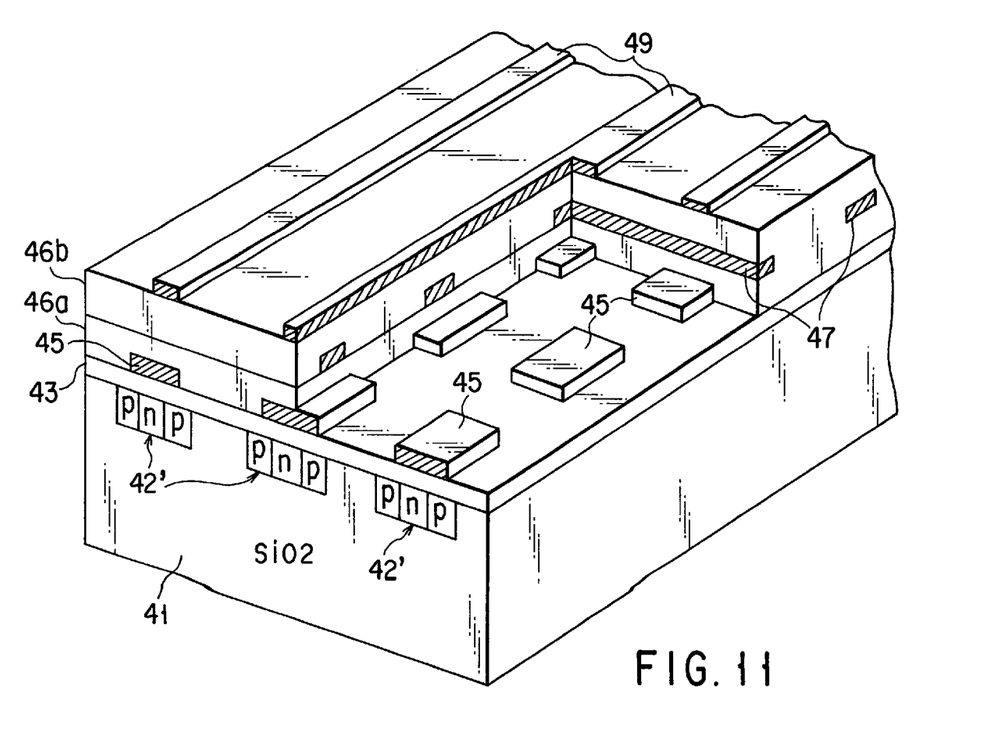

Further, the field effect transistor is not limited to the MOS type and a MIS type using a gate insulating film instead of the gate oxide film can be used. Also, the Si stripes 32, 42 are not limited to the npn structure and Si stripes 32', 42' of pnp structure as shown in FIGS. 10 and 11 may be used if they constitute p-channel transistors. In addition, this invention can be variously modified without departing from the technical scope thereof.

As described above, according to this invention, two ferroelectric capacitors having substantially the same remnant polarization amount are connected to the gate electrode of the MOS or MIS field effect transistor to form a memory cell structure and the thin ferroelectric films of the capacitors are polarized in the opposite directions to each other with respect to the gate electrode of the transistor to store information. Therefore, since a voltage is directly applied to the thin ferroelectric film, an information programming voltage can be lowered and charges caused by the polarization of the thin ferroelectric film are not induced on the semiconductor surface of the channel region of the transistor, and since the internal electric fields of the two ferroelectric capacitors become 0 in the steady state after information is stored, information holding time can be made long.

Further, at the time of information readout, after a positive voltage pulse is applied to one of the terminals which are on the opposite side of the gate electrodes of the capacitors while the other terminal is kept in the electrically floating state, a negative voltage pulse having an absolute value smaller than the positive voltage pulse is applied so that a reduction amount of the remnant polarization after the readout operation for the programming data "1" can be suppressed, thereby making it possible to simplify the readout operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric nonvolatile memory having memory cells each for storing information by utilizing the polarization of a ferroelectric film, each of said memory cells comprising:

a field effect transistor;

a first ferroelectric capacitor having one of electrodes connected to a gate electrode of said field effect transistor; and a second ferroelectric capacitor in which one of electrodes is connected to the gate electrode of said field effect transistor and the remnant polarization amount is substantially equal to that of said first ferroelectric capacitor;

wherein information is stored by polarizing thin ferroelectric films of said first and second ferroelectric capacitors in opposite directions to each other with respect to the gate electrode of said field effect transistor.

2. The ferroelectric nonvolatile memory according to claim 1, wherein said field effect transistor is one of MOS type and MIS type.

3. The ferroelectric nonvolatile memory according to claim 1, wherein said first and second ferroelectric capacitors are the same in the constituent material and area and the film thicknesses of the thin ferroelectric films thereof are set equal to each other.

4. The ferroelectric nonvolatile memory according to claim 1, wherein said first and second ferroelectric capacitors are the same in the constituent material and area and the film thicknesses of the thin ferroelectric films thereof are different from each other.

5. A storage/holding method of a ferroelectric nonvolatile memory which has memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor; comprising the steps of:

polarizing the thin ferroelectric films of the first and second ferroelectric capacitors in opposite directions to each other with respect to the gate electrode of the field effect transistor by grounding the other electrode of the second ferroelectric capacitor and applying a voltage to the other electrode of the first ferroelectric capacitor; and setting the other electrode of the first ferroelectric capacitor to 0V.

6. A readout method of a ferroelectric nonvolatile memory which has memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor and in which information is stored by polarizing the thin ferroelectric films of the first and second ferroelectric capacitors in opposite directions to each other with respect to the gate electrode of the field effect transistor, comprising the steps of:

setting the other electrode of the second ferroelectric capacitor into an electrically floating state;

applying a positive voltage pulse to the other electrode of the first ferroelectric capacitor; and detecting a drain current in the field effect transistor to determine stored information.

7. The readout method of the ferroelectric nonvolatile memory according to claim 6, further comprising the step of setting the other electrodes of the first and second ferroelectric capacitors to 0V after said step of determining the stored information.

8. A readout method of a ferroelectric nonvolatile memory which has memory cells each including a field effect transistor, a first ferroelectric capacitor having one of electrodes connected to a gate electrode of the field effect transistor, and a second ferroelectric capacitor in which one of electrodes is connected to the gate electrode of the field effect transistor and the remnant polarization amount is substantially equal to that of the first ferroelectric capacitor and in which information is stored by polarizing the thin ferroelectric films of the first and second ferroelectric capacitors in opposite directions to each other with respect to the gate electrode of the field effect transistor, comprising the steps of:

setting the other electrode of the second ferroelectric capacitor into an electrically floating state;

applying a positive voltage pulse to the other electrode of the first ferroelectric capacitors; and subsequently applying a negative voltage pulse whose absolute value is smaller than the positive voltage pulse to the other electrode of the first ferroelectric capacitor.

9. The readout method of the ferroelectric nonvolatile memory according to claim 8, wherein the level of the negative voltage pulse is ½ to ⅓ of that of the positive voltage pulse.

* * * * *

UNITED STATES PATENT AND TRADEMARK OFFICE
CERTIFICATE OF CORRECTION

PATENT NO. : 6,188,600 B1
DATED : February 13, 2001
INVENTOR(S) : H. Ishiwara

It is certified that error appears in the above-identified patent and that said Letters Patent is hereby corrected as shown below:

Column 2,
Item [56] References Cited (Other Publications),
Insert in appropriate order the following:

-- Ishiwara, Hiroshi; "Proposal of a Novel Ferroelectric-Gate Field Effect Transistor with separated Functions for Data read-Out and Data Storage"; *Extended Abstracts of the 1998 International Conference on Solid State Devices and Materials*; 222-223; 1998. Tokumitsu, Eisuke, et al.; "Nonvolatile Memory Operations of Metal-Ferroelectric-Insulator-Semiconductor (MFIS) FET's using PLZT/STO/Si(100) Structures"; *IEEE Electron Device Letters*; 18(4):160-162; April 1997.
Fukimori, Yoshikazu, et al.; "Properties of Ferroelectric Memory FET Using $Sr_2(Ta, Nb)_2O$ Thin Film"; *Jpn. J. Appl. Phys.*; 38:2285-2288; April 1999. --

Signed and Sealed this

Sixth Day of November, 2001

Attest:

NICHOLAS P. GODICI
*Attesting Officer*        *Acting Director of the United States Patent and Trademark Office*